(12) United States Patent
Kokubun et al.

(10) Patent No.: US 8,924,828 B2
(45) Date of Patent: Dec. 30, 2014

(54) MEMORY CONTROLLER, SEMICONDUCTOR STORAGE DEVICE, AND MEMORY CONTROL METHOD FOR ERROR CORRECTION USING CHIEN SEARCH

(71) Applicant: Kabushiki Kaisha Toshiba, Tokyo (JP)

(72) Inventors: Naoaki Kokubun, Kanagawa (JP); Ryo Yamaki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 61 days.

(21) Appl. No.: 13/757,976

(22) Filed: Feb. 4, 2013

(65) Prior Publication Data

US 2014/0068392 A1    Mar. 6, 2014

Related U.S. Application Data

(60) Provisional application No. 61/695,158, filed on Aug. 30, 2012.

(51) Int. Cl.
  *H03M 13/00* (2006.01)
  *H03M 13/15* (2006.01)
(52) U.S. Cl.
  CPC .......... *H03M 13/159* (2013.01); *H03M 13/152* (2013.01); *H03M 13/1545* (2013.01); *H03M 13/6561* (2013.01)
  USPC .......................................... 714/785; 714/784
(58) Field of Classification Search
  CPC .......... G06F 11/1008; H03M 13/1545; H03M 13/1525; H03M 13/157; H03M 13/159
  USPC ................................................... 714/784, 785
  See application file for complete search history.

(56) References Cited

U.S. PATENT DOCUMENTS

| | | | | |
|---|---|---|---|---|
| 6,131,178 A * | 10/2000 | Fujita et al. | .................... | 714/784 |
| 6,571,368 B1 * | 5/2003 | Chen | .............................. | 714/784 |
| 7,020,826 B2 * | 3/2006 | Litwin et al. | ................... | 714/784 |
| 7,249,310 B1 * | 7/2007 | Feng et al. | ..................... | 714/784 |
| 7,581,155 B2 * | 8/2009 | Lee et al. | ....................... | 714/779 |
| 7,890,846 B2 * | 2/2011 | Lee et al. | ....................... | 714/784 |
| 8,055,977 B2 * | 11/2011 | Ito | .................................. | 714/758 |
| 8,667,367 B2 * | 3/2014 | Khellah et al. | ................ | 714/763 |

FOREIGN PATENT DOCUMENTS

| | | |
|---|---|---|
| JP | 8-125547 | 5/1996 |
| JP | 2001-44853 | 2/2001 |
| JP | 2001-86005 | 3/2001 |

* cited by examiner

*Primary Examiner* — Esaw Abraham
(74) *Attorney, Agent, or Firm* — Oblon, Spivak, McClelland, Maier & Neustadt, L.L.P.

(57) ABSTRACT

According to one embodiment, a memory controller including a syndrome calculation unit which calculates syndrome based on code word which have the ability to correct t bits, an error locator polynomial calculation unit, and a Chien search unit, wherein the Chien search unit includes a root shift block which shifts all roots, a division block which divides the output from the root shift block by a predetermined polynomial, of which the order is smaller than t, and substitution block which substitutes elements into the remainder polynomial to examine if they are the roots of the remainder, and wherein the predetermined polynomial has at least one root which value is the same as one of the substituted elements.

10 Claims, 11 Drawing Sheets

DIVISOR ⟶ $\alpha^{13}x + \alpha^9$ ⟵ QUOTIENT $\alpha^2 x^3 + \alpha^{13} x^2 + \alpha^{13} x + \alpha^{10} \,\overline{)\, x^4}$ ⟵ DIVIDEND $\phantom{\alpha^2 x^3 + \alpha^{13} x^2 + \alpha^{13} x + \alpha^{10} )}\,-)\ \alpha^{11}x^3 + \alpha^{11}x^2 + \alpha^8 x$

RESULT OF FIRST STEP ⟶ $\alpha^{11}x^3 + \alpha^{11}x^2 + \alpha^8 x$ $\phantom{xxxxxxx}-)\ \alpha^{11}x^3 + \alpha^7 x^2 + \alpha^7 x + \alpha^4$

RESULT OF SECOND STEP ⟶ $(\alpha^{11} + \alpha^7)x^2 + (\alpha^8 + \alpha^7)x + \alpha^4 = \alpha^8 x^2 + \alpha^{11} x + \alpha^4$

REMAINDER ⟶

MEMORY CONTROLLER, SEMICONDUCTOR STORAGE DEVICE, AND MEMORY CONTROL METHOD FOR ERROR CORRECTION USING CHIEN SEARCH

CROSS-REFERENCE TO RELATED APPLICATIONS

This application is based upon and claims the benefit of priority from Provisional Patent Application No. 61/695,158, filed on Aug. 30, 2012; the entire contents of which are incorporated herein by reference.

FIELD

Embodiments described herein relate generally to a memory controller, a semiconductor storage device, and a memory control method.

BACKGROUND

The Chien search is the algorithm to find the roots of an error locator polynomial over a field by substituting every element of the field. A serial Chien search circuit searches the roots by substituting a single element per clock cycle. In order to speed up the searching time, a parallel structure of the Chien search is required. However, its parallelism increases the area of the circuit.

In order to make our embodiment clear, we divide a Chien search circuit into two function blocks: root shift block and substitution block. Root shift block of p-parallel Chien search transforms the current polynomial which roots are, for instance, $\{\beta_1, \beta_2\}$ into another one which roots are $\{\alpha^p \times \beta_1, \alpha^p \times \beta_2\}$. Substitution block of p-parallel Chien search substitutes $\alpha^0, \alpha^1, \ldots,$ and $\alpha^{p-1}$ into a shifted polynomial which is an output from root shift block. When the parallel factor p increases, substitution block needs an additional circuit to substitute another field element, while root shift block does not need an additional circuit but requires only replacement of the shift factor. Therefore, as the parallel factor p increases, so the area of substitution block increases, while increase of the area of root shift block is much less than that of substitution block.

DETAILED DESCRIPTION

In general, according to one embodiment, a memory controller including a syndrome calculation unit which calculates syndrome based on code word which have the ability to correct t bits, an error locator polynomial calculation unit, and a Chien search unit. The Chien search unit includes a root shift block which shifts all roots, a division block which divides the output from the root shift block by a predetermined polynomial, of which the order is smaller than t, and substitution block which substitutes elements into the remainder polynomial to examine if they are the roots of the remainder, and wherein the predetermined polynomial has at least one root which value is the same as one of the substituted elements.

Hereinafter, a memory controller, a semiconductor storage device, and a memory control method according to the embodiments will be described in detail with reference to the attached drawings. In addition, the present invention is not limited to the embodiments.

First Embodiment

Figure 1:
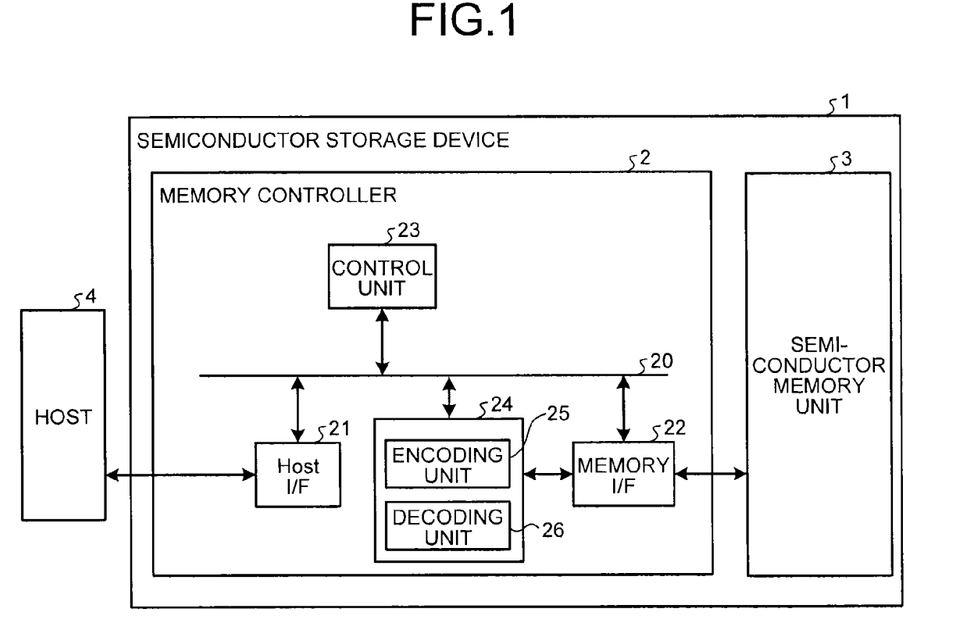
FIG. 1 is a block diagram illustrating an example of a configuration of a semiconductor storage device according to a first embodiment.

FIG. 1 is a block diagram illustrating an example of a configuration of a semiconductor storage device according to a first embodiment. A semiconductor storage device 1 according to the embodiment includes a memory controller 2 and a semiconductor memory unit (memory) 3. The semiconductor storage device 1 can be connected to a host 4. FIG. 1 illustrates a state where the semiconductor storage device 1 is connected to the host 4. The host 4 is, for example, an electric apparatus such as a personal computer or a mobile terminal.

The semiconductor memory unit 3 is a non-volatile memory which stores data in a non-volatile manner, for example, a NAND memory. In addition, herein, although an example where a NAND memory is used as the semiconductor memory unit 3 is described, any storage unit other than the NAND memory may be used as the semiconductor memory unit 3. In the NAND memory, a write unit (minimum write) generally referred to as a page exists, and writing is performed in units of a page.

The memory controller 2 controls writing of the semiconductor memory unit 3 according to a write command (request) from the host 4 and controls reading from the NAND memory 3 according to a read command (request) from the host 4. The memory controller 2 includes a Host I/F 21, a memory I/F 22, a control unit 23, and an ECC (Error correction code) unit 24. The ECC unit 24 includes an encoding unit 25 and a decoding unit 26. The Host I/F 21, the memory I/F 22, the control unit 23, the encoding unit 25, and the decoding unit 26 are connected to one another via an internal bus 20.

The Host I/F 21 performs a process according to an interface standard with respect to the host 4 to output instructions, user data, and the like received from the host 4 to the internal bus 20. In addition, the Host I/F 21 transmits user data read from the semiconductor memory unit 3, responses from the control unit 23, and the like to the host 4.

The memory I/F 22 controls a process of writing write data in the semiconductor memory unit 3 and a process of reading write data from the semiconductor memory unit 3 based on instructions of the control unit 23.

The control unit 23 collectively controls components of the semiconductor storage device 1. In the case where an instruction is received from the host 4 through the Host I/F 21, the control unit 23 performs control according to the instruction. For example, the control unit 23 instructs the memory I/F 22 to write a code word (user data and parity) in the semiconductor memory unit 3 and to read the code word from the semiconductor memory unit 3 according to an instruction from the host 4.

The encoding unit 25 encodes the user data transmitted to the internal bus 20 to generate the code word which consists of the user data and the parity. Although any code may be used as ECC, for example, a BCH code, or the like may be used. Hereinafter, an example where the BCH code is used will be described.

The decoding unit 26 decodes the word read from the semiconductor memory unit 3. Since the received data almost always contains error, it is sent to the decoding unit 26 from the semiconductor memory unit 3 through the memory I/F 22 to identify the error.

Figure 2:
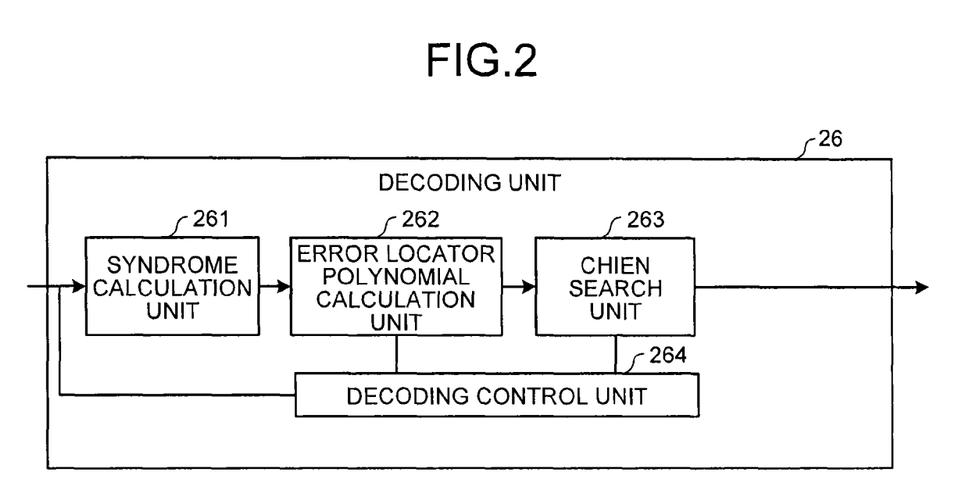
FIG. 2 is a diagram illustrating an example of a configuration of a decoding unit according to the first embodiment.

FIG. 2 is a diagram illustrating an example of a configuration of the decoding unit 26. As illustrated in FIG. 2, the decoding unit 26 includes a syndrome calculation unit 261, an error locator polynomial calculation unit 262, a Chien search unit 263, and a decoding control unit 264.

Figure 3:
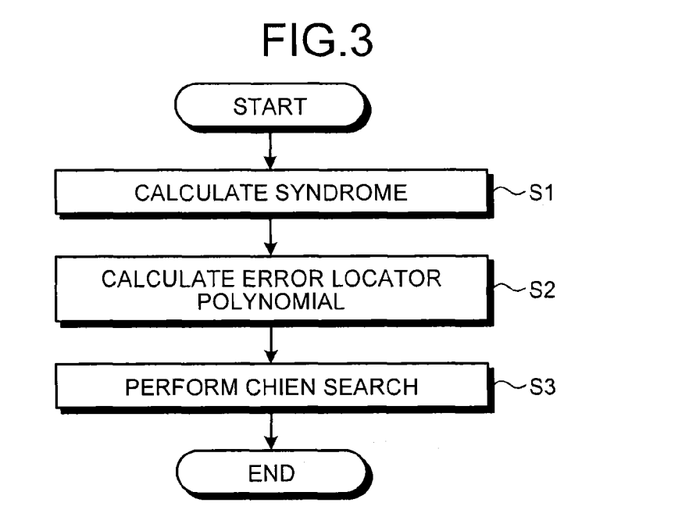
FIG. 3 is a flowchart illustrating an example of a decoding process procedure according to the first embodiment.

FIG. 3 is a flowchart illustrating an example of a decoding process procedure according to the embodiment. The whole operations of the decoding process according to the embodiment will be described with reference to FIGS. 2 and 3. When the control unit 23 receives a data read request from the host 4 through the Host I/F 21, the control unit 23 instructs the memory I/F 22 to read reading-object data. The memory I/F 22 reads the reading-object data together with the corresponding parity and transfers the data and the parity to the decoding unit 26. When the decoding unit 26 receives the reading-object data and the parity from the memory I/F 22, the decoding unit 26 starts a decoding process.

First, if the decoding process is started, the decoding control unit 264 instructs the syndrome calculation unit 261 to compute the value of syndrome (Step S1). Next, the decoding control unit 264 instructs the error locator polynomial calculation unit 262 to derive error locator polynomial from syndrome (Step S2).

Next, the decoding control unit 264 instructs the Chien search unit 263 to perform Chien search by using error locator polynomial (Step S3) to identify error positions, and the process is ended. The decoding control unit 264 performs error correction by flipping bits which are identified as erroneous ones by the Chien search.

Figure 4:
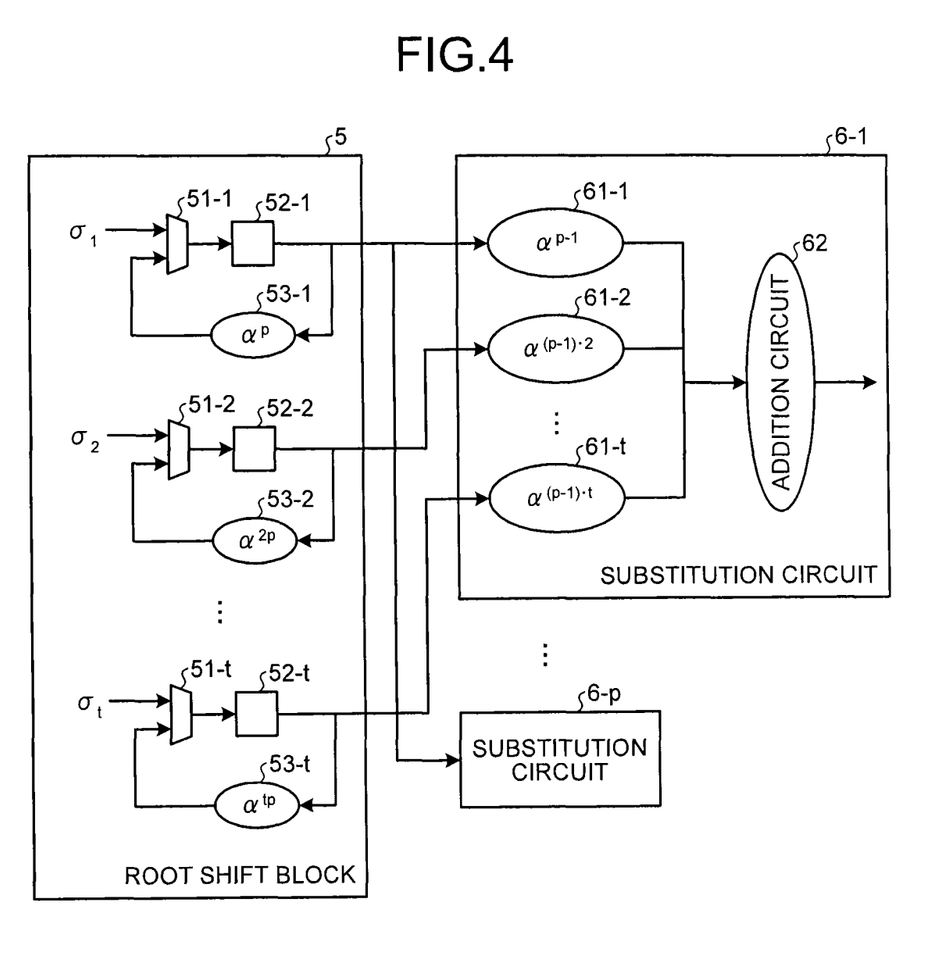
FIG. 4 is a diagram illustrating an example of a configuration of a general Chien search circuit performing parallel Chien search.

Hereinbefore, in the Chien search of the decoding process described, the roots of an error locator polynomial are searched by sequentially substituting candidates for the root into the polynomial. A parallel Chien search circuit is required to realize high-throughput. FIG. 4 is a diagram illustrating an example of a configuration of a general circuit performing p-parallel Chien search.

In FIG. 4, we use the following notations: the maximum number of erroneous bits that can be corrected by decoding is denoted by t; an error locator polynomial is expressed by $\sigma(x)$; the coefficient of $x^i$ of $\sigma(x)$ is denoted by $\sigma_i$; and the number of substitution circuits is denoted by p. As illustrated in FIG. 4, the p-parallel Chien search circuit in the related art consists of root shift block 5 and substitution block. Root shift block transforms an input polynomial, which coefficients are stored in registers 52-1 to 52-t, into another polynomial, all of which roots are the input roots multiplied by $\alpha^{-p}$. Substitution block comprises substitution circuits 6-1 to 6-p. The substitution circuit 6-p evaluates an input polynomial for $x=\alpha_{p-1}$.

The root shift block 5 includes a selector 51-i, a register 52-i, and a multiplier 53-i for each term of the error locator polynomial, wherein i=1, . . . , t. At the initial step, the selector 51-i selects $\sigma_i$ of the input error locator polynomial and stores the coefficient in the register 52-i.

In the first cycle, the current value $\sigma_i$ stored in the register 52-i is output into each of the substitution circuits 6-1 to 6-p in substitution block. In addition, the selector 51-i selects an output of the multiplier 53-i in order to store the root shifted coefficient which is the current value $\sigma_i$ multiplied by $\alpha^{ip}$. Hereafter, the same process is performed in each cycle until all roots are found.

Herein, the substitution circuit 6-j (j=1, 2, . . . , p) is configured so as to substitute $\alpha^{p-j}$ into the input polynomial, which is the output of root shift block 5 and its maximum degree is t. For example, the substitution circuit 6-1 includes t multipliers 61-1 to 61-t and an addition circuit 62 which performs addition (XOR) of all multiplication results and the constant term of input polynomial. Notice that this constant term is not explicitly illustrated in FIG. 4 for simplicity. Therefore, in the first cycle, the substitution circuit 6-1 examines whether $\alpha^{p-1}$ is a root of an error locator polynomial. In the second cycle, it examines whether $\alpha^{p-1}$ is a root of input polynomial all of which roots are shifted by $\alpha^{-p}$ from the error locator polynomial, that is, it examines whether $\alpha^{-1}$ is a root of the error locator polynomial.

In generalization of the substitution circuits 6-1 to 6-p, the substitution circuit 6-j includes t multipliers 6j-i (i=1, . . . , t) which multiply the coefficience of $x^i$ of input polynomial and $\alpha^{(p-1)i}$ together and an addition circuit 62 which performs addition (XOR) on multiplication results output from the multipliers 6j-1 to 6j-t and the constant term of input polynomial. In the substitution circuit 6-p, since $\alpha^{p-p}=\alpha^0$ is substituted, the multipliers 6p-1 to 6p-t are unnecessary.

Figure 5:
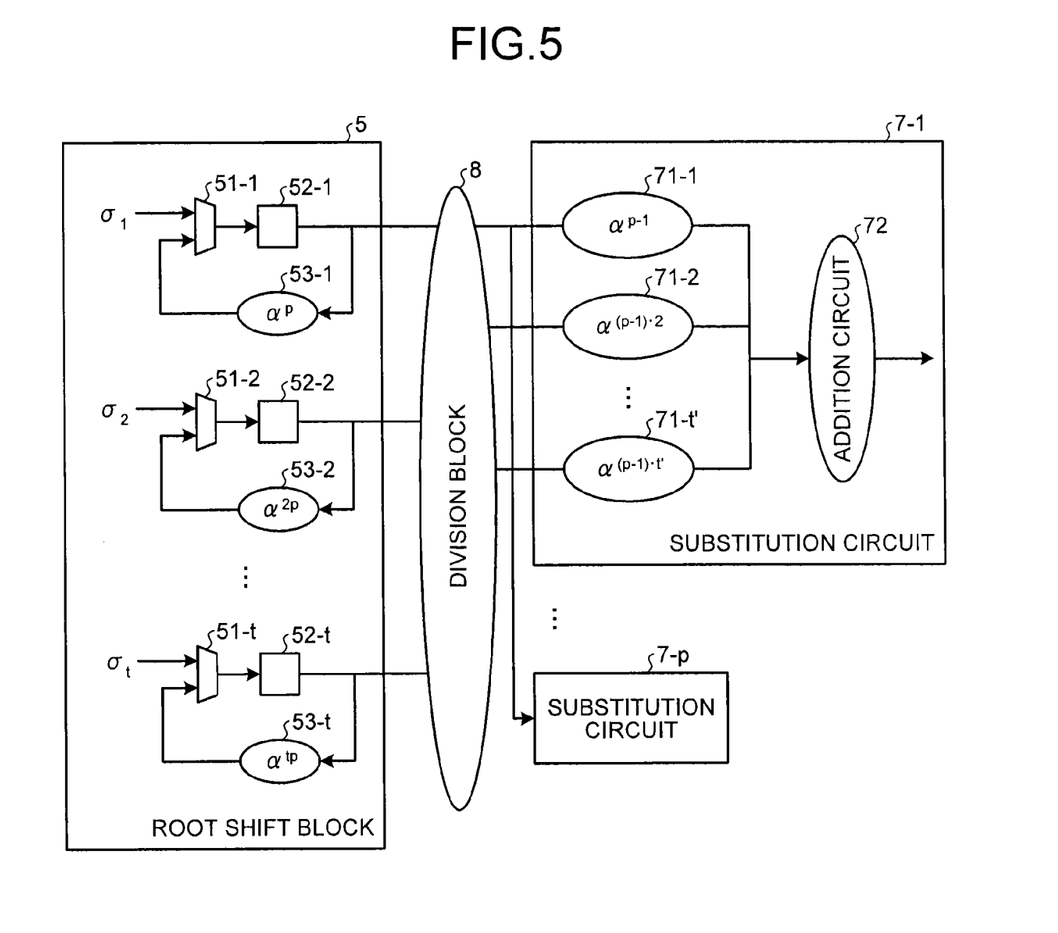
FIG. 5 is a diagram illustrating an example of a configuration of a Chien search circuit according to the first embodiment.

Next, the Chien search circuit according to the embodiment will be described. FIG. 5 is a diagram illustrating an example of a configuration of the Chien search circuit according to the embodiment. The Chien search circuit according to the embodiment is a circuit functioning as the Chien search unit 263 illustrated in FIG. 2. As illustrated in FIG. 5, the root shift block 5 is the same as a general Chien search circuit described in FIG. 4. In the embodiment, a division block 8 is installed as the following stage of the root shift block 5, and substitution circuits 7-1 to 7-p are installed at the following stage of the division block 8. The substitution circuit 7-j (j=1, 2, . . . , p) includes t' multipliers 7j-i (i=1, . . . , t' (t'<t, t' is the maximum degree of remainder polynomials described below) which multiply the coefficient of $x^i$ of a remainder polynomial by $\alpha^{(p-j)i}$. The substitution circuit 7-j also includes an addition circuit 72 which performs addition (XOR) of multiplication results output from the multipliers 7j-1 to 7j-t' and the constant term of input polynomial. This input polynomial is an output of the division block 8 and its constant term is not explicitly illustrated in FIG. 5. The substitution circuit 7-j is the same as the substitution circuit 6-j excluding the point that the number of the multipliers is decreased from t to t'.

The division operation according to the embodiment will be described. Divisor, quotient and remainder are denoted by m(x), q(x) and r(x), respectively. Dividend denoted by $\sigma(x)$ is an output of the root shift block 5. In general, these polynomial obey the following relation.

$$\sigma(x) = m(x) \cdot q(x) + r(x) \quad (1)$$

In the case where the dividend σ(x) and the divisor m(x) have a common root $\alpha_c$, σ(x) and m(x) can be factored into the following expressions (2) and (3), respectively.

$$\sigma(x) = (x + \alpha_c)\sigma_{/\alpha c}(x) \quad (2)$$

$$m(x) = (x + \alpha_c)m_{/\alpha c}(x) \quad (3)$$

In these expressions, $\sigma_{/\alpha c}(x)$ and $m_{/\alpha c}(x)$ denote the remaining factors of σ(x) and m(x) after the factorization of the common root $\alpha_c$, respectively.

By substituting Equations (2) and (3) into Equation (1), Equation (1) turns into the following Equation (4).

$$r(x) = (x + \alpha_c)\{\sigma_{/\alpha c}(x) - m_{/\alpha c}(x) \cdot q(x)\} \quad (4)$$

It can be understood from Equation (4) that the remainder polynomial r(x) also has the common root $\alpha_c$. Therefore, instead of examining if an element is a root of σ(x), we can examine if the element is a root of r(x) when divisor has the element as a root. Since degree of remainder is smaller than that of dividend, the area of substitution circuit for remainder is smaller than that of dividend.

Figure 6:
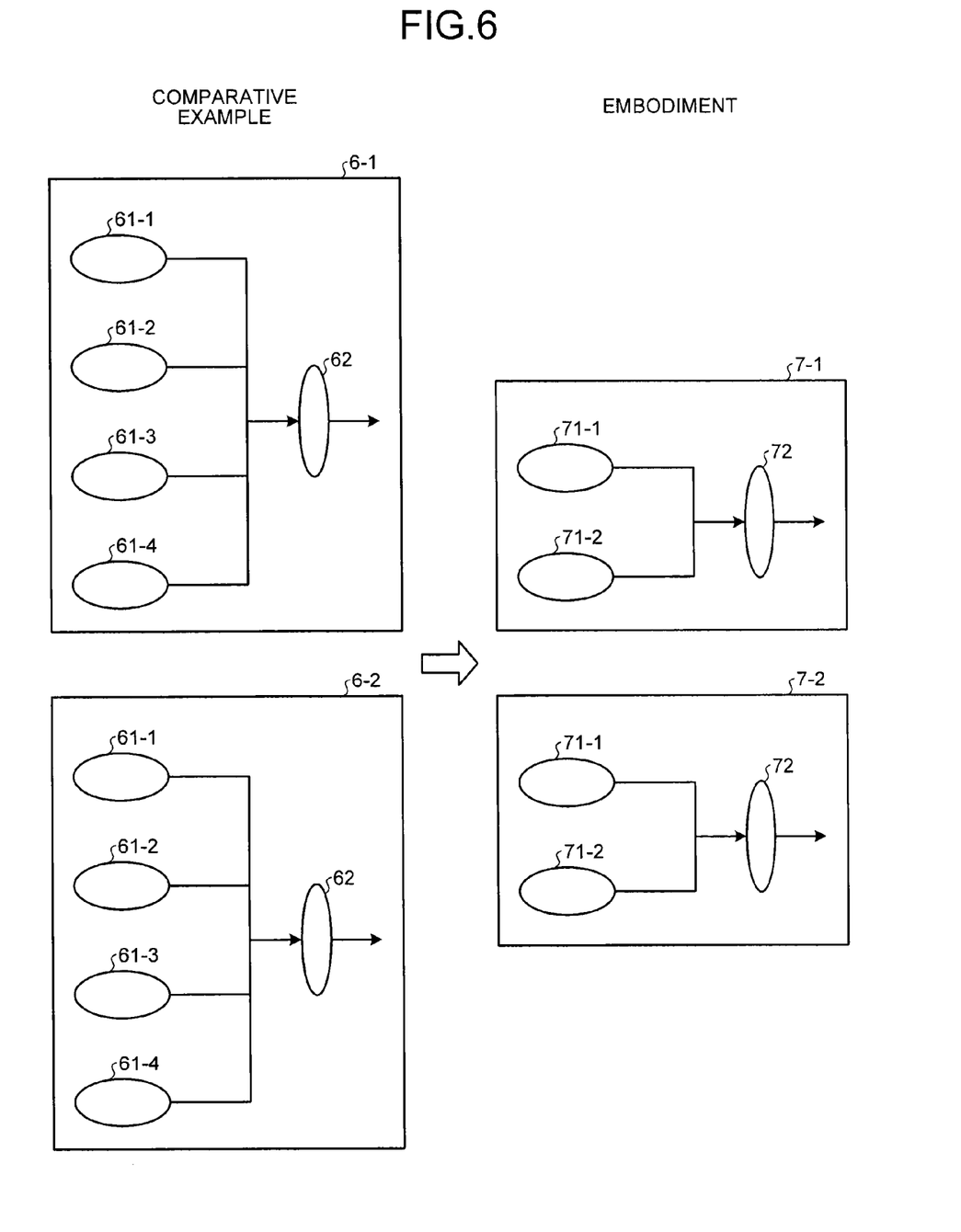
FIG. 6 is a diagram for describing effects of the first embodiment.

FIG. 6 is a diagram for explaining effects of the embodiment. FIG. 6 illustrates an example where t=4, p=2, and t'=2. The left side of FIG. 6 illustrates a comparative example corresponding to the example illustrated in FIG. 4, and the right side illustrates an example of the embodiment. The comparative example and the embodiment are the same in terms of the number of substitution circuits. However, in the embodiment, the number of multipliers in each substitution circuit is decreased in comparison with the comparative example, so that it is possible to reduce the circuit area of substitution block.

The division operation according to the embodiment may be configured in an arbitrary manner. With respect to the method of selecting the divisor, the number of steps per cycle of long division, and the like, various examples can be considered. For example, the following Equation (5) may be used as a divisor.

$$m(x) = (x + \alpha^0)(x + \alpha^1)(x + \alpha^2) \ldots (x + \alpha^{p-1}) \quad (5)$$

The set of all roots of this divisor is equivalent to the set of all field elements substituted by substitution circuits 7-1 to 7-p. A divisor may not necessarily include all the roots. In the case, as described in the embodiment described below, substitution block consists of two types of substitution circuits. Input polynomial of some substitution circuits is dividend, that is, the output of root shift block 5, whereas that of the other substitution circuits is the remainder of the dividend.

Figure 7:
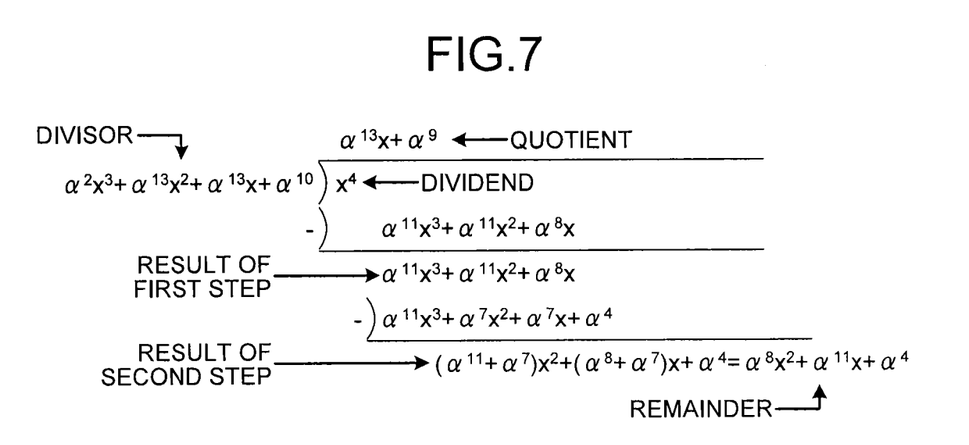
FIG. 7 is a diagram for describing long division.

FIG. 7 is a diagram for explaining polynomial long division. In FIG. 7, dividend is $x^4$ and divisor is $\alpha^2 x^3 + \alpha^{13} x^2 + \alpha^{13} x + \alpha^{10}$. The result of the first step calculation is $\alpha^{11} x^3 + \alpha^{11} x^2 + \alpha^8 x$. The result of the second step calculation is the remainder $\alpha^8 x^2 + \alpha^{11} x + \alpha^4$.

Next, the number of cycle to finish the division will be described. If a circuit to perform all steps of long division in 1 cycle is implemented, the number of cycle to finish the division is 1. If a circuit to perform all steps of long division in 2 cycles is implemented, the number is 2. The circuit area of the division block 8 is inversely proportional to the number of cycle to finish the division.

For example, when the divisor is Equation (5), since the degree of the divisor is p, p field multiplication operations are needed for one step of division. When the degree of dividend is t, the number of all steps is t−p+1. In the case where the number of cycle to finish the division is 1, the number of multiplication needed for the division operation is p×(t−p+1), where p is the number of multiplication per step.

On the other hand, the number of multiplication in substitution circuit 7-1 is t'=p−1, because the input polynomial into substitution circuit in FIG. 5 is a remainder which degree is p−1. Hence, decrease of multiplication of the substitution circuit 7-1 in comparison with that of 6-1 is t−t'=t−p+1. Since the number of the substitution circuits is p−1 (the substitution circuit for $\alpha^0$ does not use multiplication), decrease of multiplication in substitution block is (p−1)×(t−p+1). Since the net difference of multiplication between FIG. 4 and FIG. 5 is +(t−p+1), advantage is not obtained in the case where the number of cycle to finish the division is 1.

However, if the number of cycle to finish the division is 2, the area of division block 8 is reduced to half, because the circuit performs half of all steps in every cycle. In this case, the net difference of multiplication between FIG. 4 and FIG. 5 is −(p/2−1)×(t−p+1). If the number of cycle to finish the division is appropriately set according to the value of t, p, or m(x), it is possible to effectively reduce the number of multiplication circuits.

Figure 8:
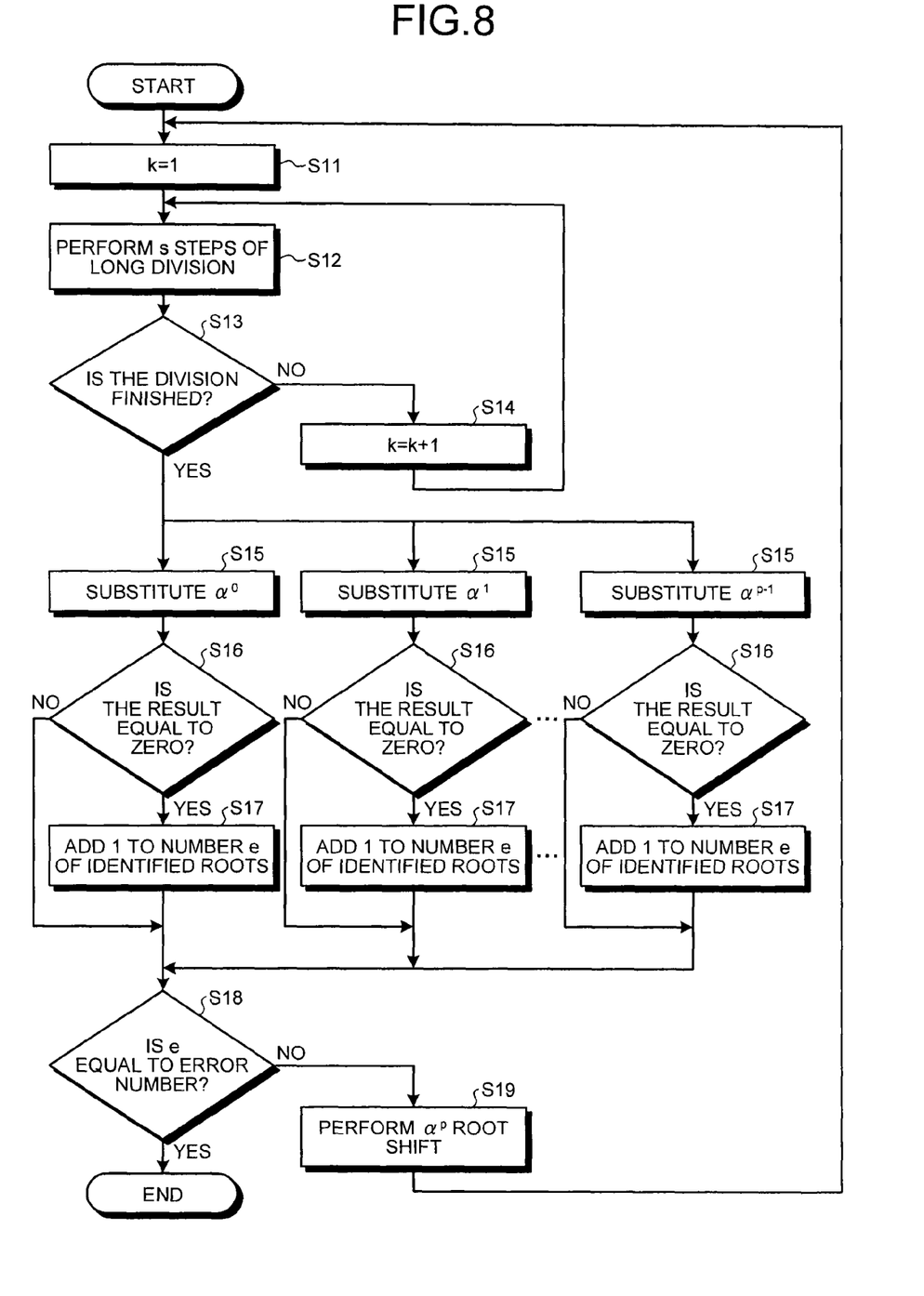
FIG. 8 is a flowchart illustrating an example of a Chien search procedure according to the first embodiment.

FIG. 8 is a flowchart illustrating an example of a Chien search procedure of the Chien search unit 263 according to the embodiment. In this example, the division block 8 includes a division operation circuit performing s steps of division. First, when the Chien search process is started, the decoding control unit 264 instructs the error locator polynomial calculation unit 262 to input a coefficient of an error locator polynomial to the root shift block 5. Next, the decoding control unit 264 (or a Chien search control unit (not illustrated) controlling the Chien search unit 263 or the division block 8) sets a variable k to 1 (Step S11), where k is the repetition number of s steps calculation of long division. The division block 8 performs s steps of long division (Step S12). The decoding control unit 264 (or Chien search control unit or the division block 8) determines the maximum of k according to the degree of an input error locator polynomial which is informed by the error locator polynomial calculation unit 262 (Step S13). Until k equals to the maximum, k=k+1 (Step S14), and the process returns to Step S12.

In Step S13, in the case where all steps of long division are finished (Yes in Step S13), the remainder is input into the substitution circuits 7-1 to 7-p, and substitution process is performed by each of the substitution circuits 7-1 to 7-p (Step S15). The substitution circuit 7-j (j=1, 2, . . . , p) determines whether the root of the input polynomial (the remainder) is $\alpha^{(p-j)}$ (Step S16). In the case where the input polynomial has the root (Yes in Step S16), 1 is added to a value e which indicates the number of the identified roots of the error locator polynomial (Step S17). Otherwise (No in Step S16), e does not change.

Next, the decoding control unit 264 (or Chien search control unit) determines whether the value e (number of identified roots) is equal to the error number obtained through the error locator polynomial calculation unit 262 (Step S18). In the case where the value e is equal to the error number (Yes in Step S18), the process is ended. Otherwise (No in Step S18), the root shift block 5 turns a current polynomial, which is stored in registers 52-1 to 52-t, into the shifted polynomial all of which roots are the current polynomial roots multiplied by $\alpha^{-p}$ (Step S19), and the process turns to Step S11. After all roots of the error locator polynomial are identified, the error correction is performed.

FIGS. 9, 10A, 10B and 11A-11C are diagrams illustrating examples of root shift block 5 and division block 8 according to the above flowchart. Herein, both the parallel factor p and degree of the divisor are set to 16, and t is set to 63. In this case, the maximum number of steps of long division is 48 (=63−16+1). In the examples illustrated in FIGS. 9, 10, and 11, the maximum number of cycle to finish the division is set to 3, and hence circuits for 16 (=48/3) steps is implemented in division block 8.

Figure 9:
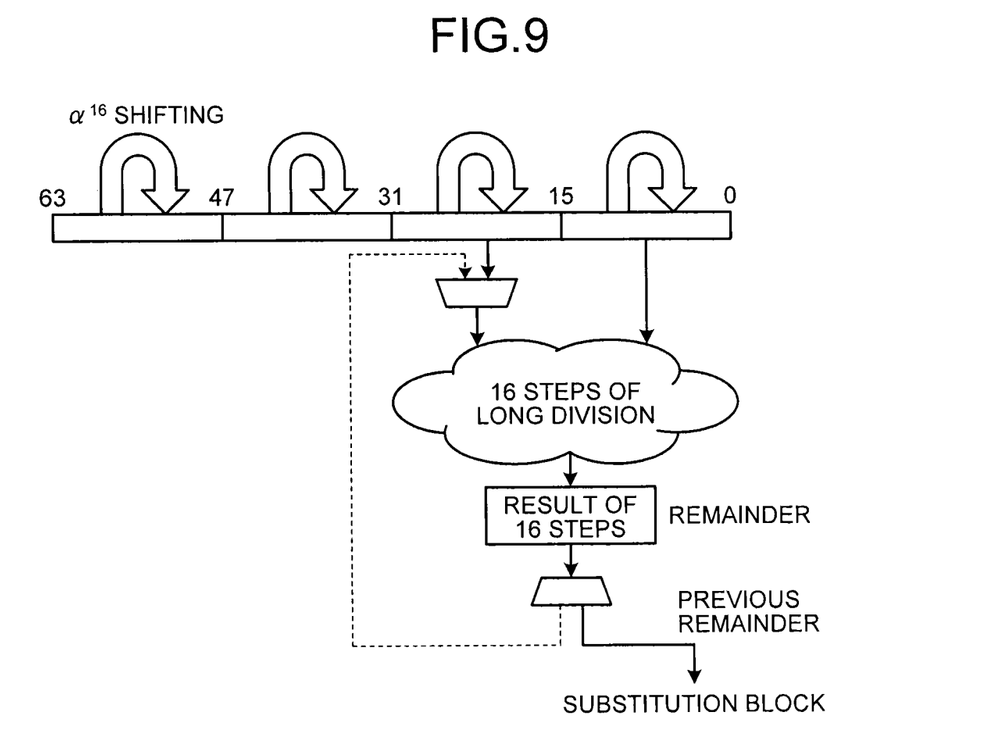
FIG. 9 is a diagram illustrating an example of root shift and division when error number is less than 32.

FIG. 9 illustrates an example where the error number is 31 or less, in other words, the order of error position polynomial is 31 or less. In the case where the error number is 31 or less, a remainder is obtained in every cycle. Hence, the polynomial stored in the root shift block 5 is input into the division block 8 every cycle, so that shifted polynomial is calculated in the root shift block 5 every cycle. The remainder is stored in registers for result of 16 steps. The remainder stored in the registers is the input of substitution block at the next cycle.

In the case where the error number is 31 or less, the number of cycle to finish the division is 1. Hereinafter, since the number of elements checked in every one cycle is equal to the parallel factor, the throughput of the case is denoted by throughput 1.

Figure 10A:
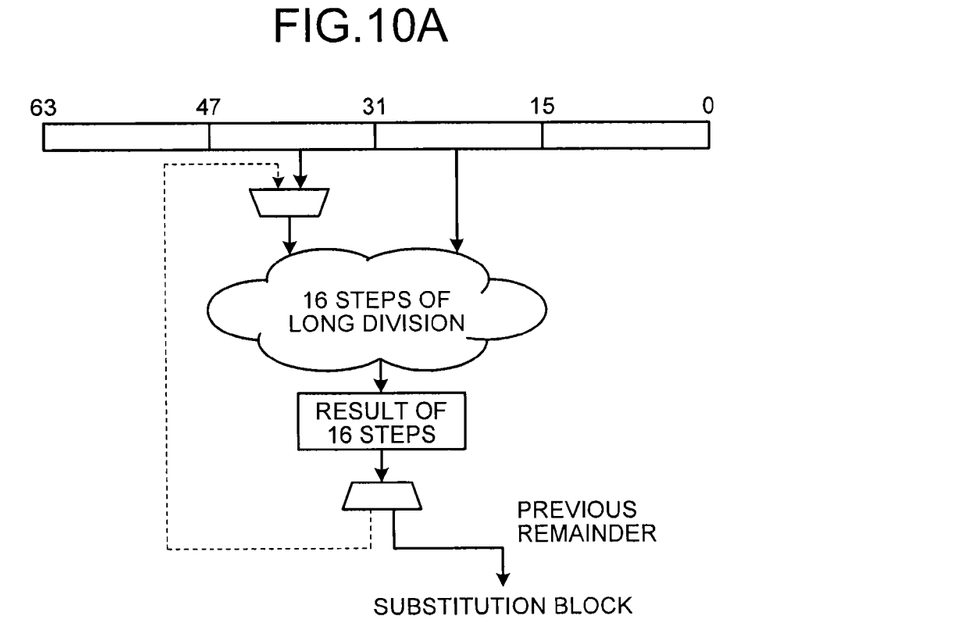
FIGS. 10A and 10B are diagrams illustrating an example of root shift and division when error number is more than 31 and less than 48.
Figure 10B:
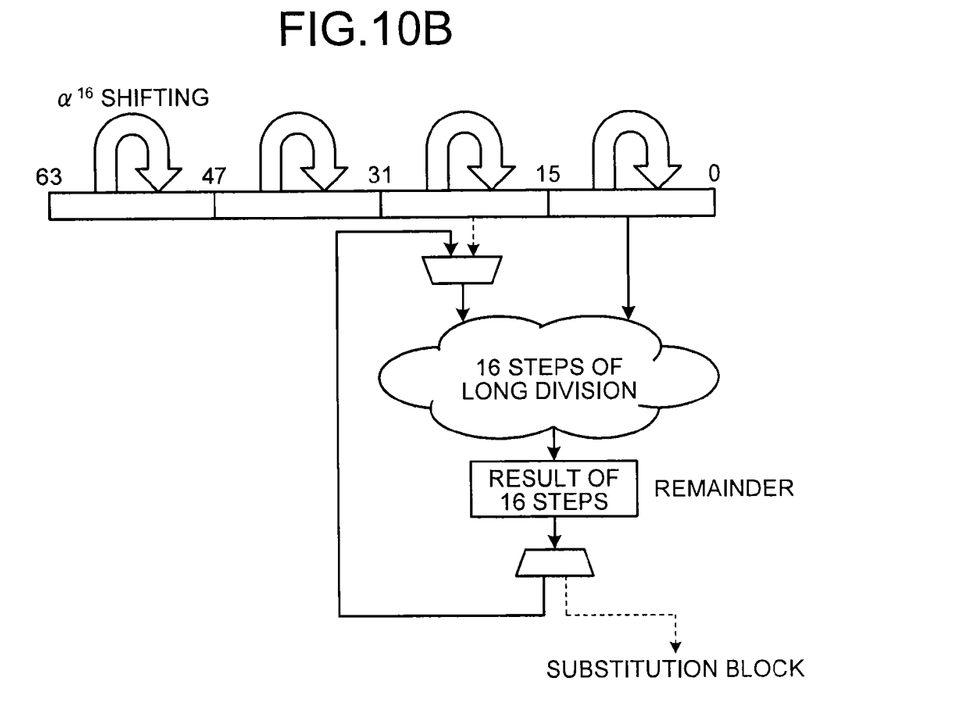

FIGS. 10A, 10B illustrate an example where the error number is 32 or more and 47 or less. In the case, it takes two cycles for the operation of 16 steps to finish the division. First, as illustrated in FIG. 10A, the first operation of 16 steps is performed on the output of the root shift block 5. The result is not input into the substitution circuits 7-1 to 7-$p$ but is stored in the division block 8. The second operation of 16 steps is performed on both the stored result and some coefficients which are stored in the root shift block 5 but not used in the first operation of 16 steps. As illustrated in FIG. 10B, since the result of the second operation of 16 steps is the remainder, the stored result in the division block 8 is input into the substitution circuits 7-1 to 7-$p$ at the next cycle. At the cycles when the second operation of 16 steps is performed, the root shifting is always performed by the root shift block 5 in order to examine if the next 16 elements are roots.

In the case where the error number is 32 or more and 47 or less, this 16-parallel Chien search circuit checks 16 elements in every second cycle, and hence the throughput is ½.

Figure 11A:
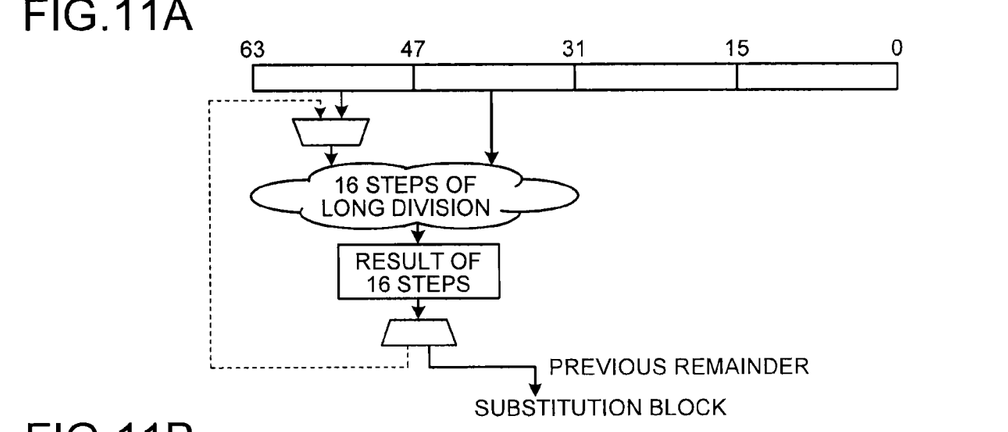
FIGS. 11A, 11B, and 11C are diagrams illustrating an example of root shift and division when error number is more than 47 and less than 64.
Figure 11B:
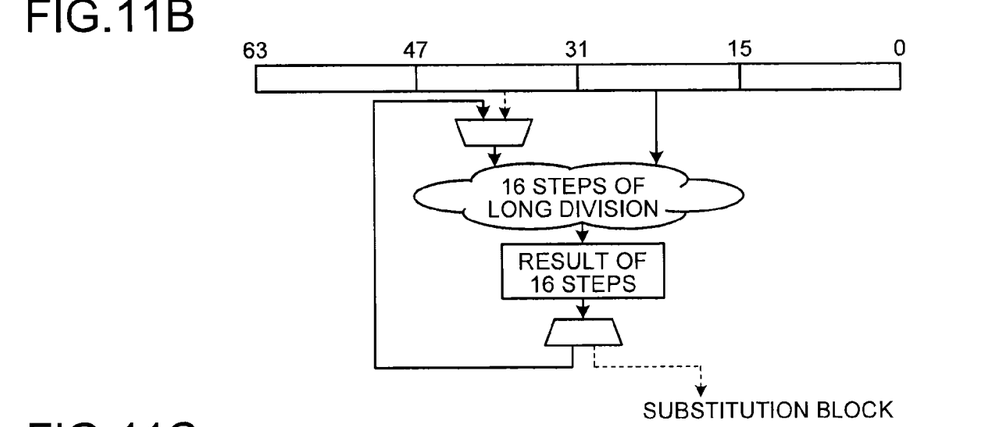
Figure 11C:
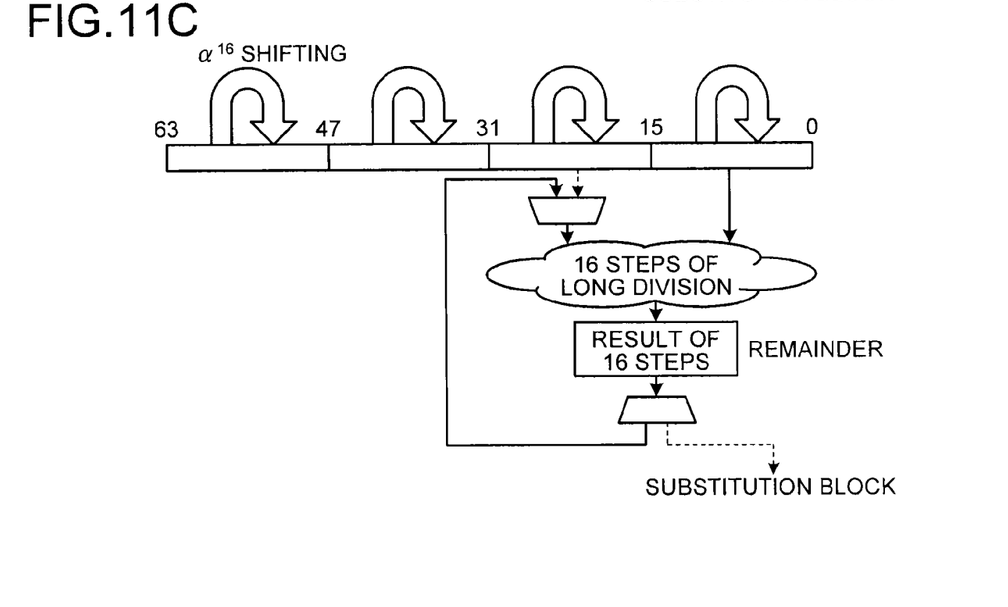

FIGS. 11A, 11B and 11C illustrate an example where the error number is 48 or more and 63 or less. In the case where the error number is 48 or more and 63 or less, this 16-parallel Chien search circuit checks 16 elements in every third cycle. As illustrated in FIG. 11A, the first operation of 16 steps is performed on the output of the root shift block 5. The result is stored in the division block 8. As illustrated in FIG. 11B, the second operation of 16 steps is performed on both the stored result and coefficients of terms from $x^{31}$ to $x^{16}$ in the root shift block 5. The result is stored in the division block 8. As illustrated in FIG. 11C, the third operation of 16 steps is performed on the stored result and coefficients of terms from $x^{15}$ to $x^0$ in the root shift block 5. The result at the third cycle is the remainder of this division, and hence it is input into the substitution circuits 7-1 to 7-$p$ in the next cycle. In the third cycle, the root shifting is performed by the root shift block 5 in order to examine if the next 16 elements are roots.

In the case where the error number is 48 or more and 63 or less, this 16-parallel Chien search circuit checks 16 elements every third cycle, and hence the throughput is ⅓.

As described hereinbefore, since the throughput of parallel Chien search can be decreased according to the error number obtained through error locator polynomial calculation unit 262, the circuit area of the division block 8 is reduced, and hence that of parallel Chien search is reduced. The condition for the throughput is reasonable with respect to power consumption. Power consumption of parallel Chien search circuit is proportional to the error number, while the power consumption is limited in order to satisfy the requirement of power consumption of decoding unit 26. In the examples described with reference to FIGS. 9, 10A, 10B and 11A-11C, since the circuit to perform the 16 steps of long division is used, the number of multiplication operations in division block 8 is 16×16=96, and the sum of multiplication operations in the substitution circuits 7-1 to 7-$p$ in substitution block is 15×15=225. Since the number of multiplication operation in the root shift block 5 is 63, the total number of the multiplication in this 16-parallel Chien search circuit is 384. In a general 16-parallel Chien search circuit, the number of the multiplication in the root shift block 5 is 63, and the number in substitution block is 15×63=1008, so that the total number of multiplication is 1071. Therefore, by rough estimation, in the embodiment, the number of multiplication can be reduced by about 64% in comparison with general Chien search.

Second Embodiment

Next, a parallel Chien search method according to a second embodiment will be described. The configuration of the semiconductor storage device according to the embodiment is the same as that of the first embodiment except that divisor used in the division block 8 in the Chien search unit 263 is replaced. Hereinafter, difference from the first embodiment will be described.

In the first embodiment, the circuit area of the division block 8 is too large to reduce the circuit area of parallel Chien search if the number of cycle to finish the division is 1. Hence, in the first embodiment, the circuit area of the division block 8 is suppressed by decreasing the throughput according to the error number. In the case where the decreasing is not desired, the number of the multiplication operations can be reduced by using a different type of divisor from the previous one. For example, the divisor is a product of minimum polynomials.

In the case where the divisor is defined by using minimum polynomials, there is a case where roots corresponding to all the substitution circuits may not be included in the divisor. Specific examples will be described. In this example, error correction capability t is set to 80, parallel factor p is set to 16, and a code length is set to $2^{14}-1=16383$ bit or less. For example, the following Equation (6) is used as a divisor.

$$m(x)=(x+\alpha^0)M_1(x)M_3(x)M_5(x) \tag{6}$$

$M_1(x)$ is a minimum polynomial including the root $\alpha$ and is expressed by the following Equation (7). $M_1(x)$ has all conjugates of $\alpha$ as roots, and hence $M_1(x)$ includes the roots $\alpha^2$, $\alpha^4$, and $\alpha^8$, which are the same as some of substitution elements in substitution block.

$$M_1(x)=x^{14}+x^{10}+x^6+x+1 \tag{7}$$

$M_3(x)$ is a minimum polynomial including the root $\alpha^3$ and is expressed by the following Equation (8). $M_3(x)$ includes conjugate roots $\alpha^6$ and $\alpha^{12}$ which are the same as some of substitution elements which are from $\alpha^0$ to $\alpha^{15}$.

$$M_3(x)=x^{14}+x^8+x^6+x^5+x^2+x+1 \tag{8}$$

$M_5(x)$ is a minimum polynomial including the root $\alpha^5$ and is expressed by the following Equation (9). $M_5(x)$ includes conjugate root $\alpha^{10}$.

$$M_5(x)=x^{14}+x^{10}+x^9+x^7+x^6+x^4+x^3+x+1 \tag{9}$$

In the case where the divisor is Equation (6), some of its roots, which are $\alpha^0, \alpha, \alpha^2, \alpha^3, \alpha^4, \alpha^5, \alpha^6, \alpha^8, \alpha^{10}$, and $\alpha^{12}$ (10 elements), are the same as some of substitution elements. Hence, an input of substitution circuits of these common elements (10 elements) is a remainder of division blocks, whereas an input of substitution circuits of the other elements is an output of root shift block 5. The divisor defined by using a minimum polynomial is not limited to the above examples, but the divisor may consist of another set of minimum polynomials.

Figure 12:
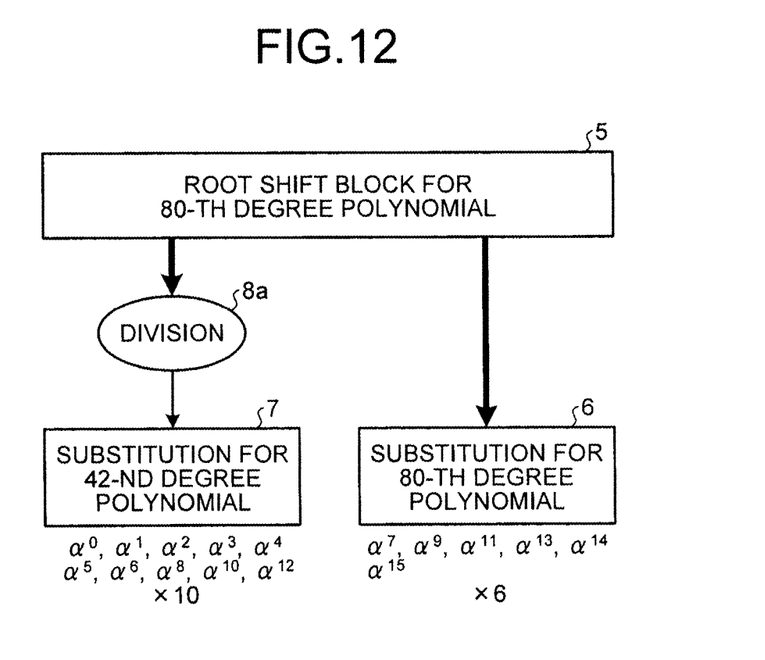
FIG. 12 is a diagram illustrating an example of a configuration of a Chien search unit according to a second embodiment.

FIG. 12 is a diagram illustrating an example of a configuration of a 16-parallel Chien search unit according to the embodiment. As illustrated in FIG. 12, the Chien search unit according to the embodiment includes a root shift block 5, a division block 8a which divisor is Equation (6), substitution circuits 7 which substitute $\alpha^0, \alpha, \alpha^2, \alpha^3, \alpha^4, \alpha^5, \alpha^6, \alpha^8, \alpha^{10}$ and $\alpha^{12}$ (10 elements), and substitution circuits 6 which substitute $\alpha^7, \alpha^9, \alpha^{11}, \alpha^{13}, \alpha^{14}$, and $\alpha^{15}$ (6 elements).

In the case where the divisor is Equation 6), since the degree of the divisor is 43, the degree of the remainder polynomial is 42 or less, that is, substitution circuits 7 include 42 multiplication circuits. Therefore, the area of substitution circuits 7 is less than that of substitution circuits 6 which include 81 multiplication circuits.

Since coefficient of minimum polynomials is limited to 0 or 1, if the divisor consists of minimum polynomials, coefficient of the divisor is also limited to 0 or 1. Therefore, if the number of cycle to finish the division is 1, the circuit area of this 16-parallel Chien search with the divisor can be smaller than that of a general 16-parallel Chien search. It goes without saying that the number of cycle to finish the division can be more than 1 in this embodiment.

For example, in the case where an operating frequency is 200 MHz, the Chien search circuit including the division block 8a is implemented under the same condition as that of FIG. 12, and registers to store the remainder are included in the division block 8a in order to shorten the path from registers in the root shift block 5 to the substitution circuits through the division block 8a. In the case, the area of this circuit is smaller than that of a general 16-parallel Chien search.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller controlling a memory, comprising:
   an encoding unit which encodes user data into code word which have the ability to correct t erroneous bits, wherein t is an integer equal to or greater than 2;
   a syndrome calculation unit which computes syndrome based on the code word read from the memory;
   an error locator polynomial calculation unit which derives an error locator polynomial from the syndrome; and
   a Chien search unit which identifies all roots of the error locator polynomial,
   wherein the Chien search unit includes:
   a root shift block which shifts all roots of the error locator polynomial;
   a division block which divides the output polynomial from the root shift block by a predetermined polynomial, of which the order is smaller than t; and
   substitution block which substitutes elements into the remainder polynomial to examine if they are the roots of the remainder, and
   wherein the predetermined polynomial has at least one root which value is the same as one of the substituted elements.

2. The memory controller according to claim 1, wherein the set of all roots of the predetermined polynomial is the same as the set of all elements substituted by the substitution block.

3. The memory controller according to claim 2, wherein some of roots of the predetermined polynomial are the same values as some of elements substituted by substitution block.

4. The memory controller according to claim 1, wherein an order of the predetermined polynomial is the number of the substitution circuits.

5. The memory controller according to claim 1,
   wherein the division operation per cycle in division block is N steps of long division (N is an integer of 1 or more), and division block stores the result of each steps as necessary.

6. The memory controller according to claim 1, wherein the predetermined polynomial is generated as a product of minimum polynomials.

7. The memory controller according to claim 6, wherein substitution block comprises two types of substitution circuits: the direct input substitution circuits and the remainder input substitution circuits, wherein the direct substitution circuits receive output from root shift block and substitute elements which are not the same as all roots of divisor used in division block, and wherein the remainder input substitution circuits receive output from division block and substitute elements which are the same as some of roots of the divisor.

8. The memory controller according to claim 6,
   wherein the division operation per cycle in division block is N steps of long division (N is an integer of 1 or more), and division block stores the result of each steps as necessary.

9. A semiconductor storage device comprising:
   an encoding unit which encodes user data into code word which have the ability to correct t erroneous bits, wherein t is an integer equal to or greater than 2;
   a memory unit which stores the code word;
   a syndrome calculation unit which computes syndrome based on the code word read from the memory;
   an error locator polynomial calculation unit which derives an error locator polynomial from the syndrome; and
   a Chien search unit which identifies all roots of the error locator polynomial,
   wherein the Chien search unit includes:
   a root shift block which shifts all roots of the error locator polynomial;
   a division block which divides the output polynomial from the root shift block by a predetermined polynomial, of which the order is smaller than t; and
   substitution block which substitutes elements into the remainder polynomial to examine if they are the roots of the remainder, and
   wherein the predetermined polynomial has at least one root which value is the same as one of the substituted elements.

10. A memory control method controlling a memory, comprising:
    encoding user data into code word which have the ability to correct t erroneous bits, wherein t is an integer equal to or greater than 2;
    calculating syndrome based on the code word read from the memory;
    deriving an error locator polynomial from the syndrome; and
    identifying all roots of the error locator polynomial, wherein, the identifying all roots of the error locator polynomial includes shifting all roots of the error locator polynomial;

dividing the output polynomial from the root shift block by a predetermined polynomial, of which the order is smaller than t; and substituting elements into the remainder polynomial to examine if they are the roots of the remainder, and wherein the predetermined polynomial has at least one root which value is the same as one of the substituted elements.

\* \* \* \* \*